US012700465B2

(12) United States Patent
Xiang

(10) Patent No.: US 12,700,465 B2
(45) Date of Patent: Aug. 4, 2026

(54) MEMORY DEVICE, SYSTEM, AND OPERATING METHOD FOR FACILITATING PROGRAMMING VERIFICATION OPERATIONS

(71) Applicant: Yangtze Memory Technologies Co., Ltd., Wuhan (CN)

(72) Inventor: Li Xiang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 141 days.

(21) Appl. No.: 18/635,793

(22) Filed: Apr. 15, 2024

(65) Prior Publication Data

US 2025/0118380 A1     Apr. 10, 2025

(30) Foreign Application Priority Data

Oct. 8, 2023     (CN) .......................... 202311295167.0

(51) Int. Cl.
*G11C 16/34*        (2006.01)
*G11C 16/04*        (2006.01)
*G11C 16/26*        (2006.01)

(52) U.S. Cl.
CPC ...... *G11C 16/3459* (2013.01); *G11C 16/0433* (2013.01); *G11C 16/26* (2013.01)

(58) Field of Classification Search
CPC . G11C 16/3459; G11C 16/0433; G11C 16/26; G11C 16/0483
See application file for complete search history.

(56) References Cited

U.S. PATENT DOCUMENTS

| | | | | |
|---|---|---|---|---|
| 9,659,656 B2 * | 5/2017 | Nguyen | ................. | G11C 16/24 |
| 10,720,212 B2 * | 7/2020 | Lee | ........................... | G11C 5/02 |
| 11,081,162 B1 * | 8/2021 | Puthenthermadam | ...................... | |
| | | | | G11C 16/10 |

(Continued)

FOREIGN PATENT DOCUMENTS

| | | |
|---|---|---|
| CN | 114446359 A | 5/2022 |
| CN | 114863963 A | 8/2022 |

(Continued)

OTHER PUBLICATIONS

Office Action in Chinese Appln. No. 202311295167.0, mailed on Aug. 29, 2025, 7 pages (with machine translation).

*Primary Examiner* — Douglas King
*Assistant Examiner* — Christopher Lane Reece
(74) *Attorney, Agent, or Firm* — Fish & Richardson P.C.

(57) ABSTRACT
The present disclosure provides memory devices, operating methods, memory systems. An example memory device includes a memory array and a peripheral circuit. The memory array includes a first and a second finger memory region, each region including multiple memory cell strings. Each memory cell string includes a first bottom select transistor (BSG). First BSGs in the first and second finger memory regions have a first and a second threshold voltage, respectively. The peripheral circuit is configured to: apply a first bias voltage to the BSGs in the first pre-charge phase of a programming verification operation on the first finger memory region; apply a second bias voltage to the first BSGs after the first pre-charge phase; the first bias voltage is smaller than the second bias voltage; and the second bias voltage is smaller than the second threshold voltage and greater than the first threshold voltage.

20 Claims, 14 Drawing Sheets

(56)                    References Cited

U.S. PATENT DOCUMENTS

| | | |
|---|---|---|
| 2010/0315861 A1 | 12/2010 | Ouchi et al. |
| 2014/0169095 A1* | 6/2014 | Avila ................... G11C 29/028 |
| | | 365/185.17 |
| 2014/0374688 A1* | 12/2014 | Wu ...................... H10B 63/845 |
| | | 438/620 |
| 2018/0068728 A1 | 3/2018 | Lee et al. |

FOREIGN PATENT DOCUMENTS

| | | |
|---|---|---|
| CN | 114999550 A | 9/2022 |
| DE | 102009021715 A1 | 12/2009 |

* cited by examiner

<u>100</u>

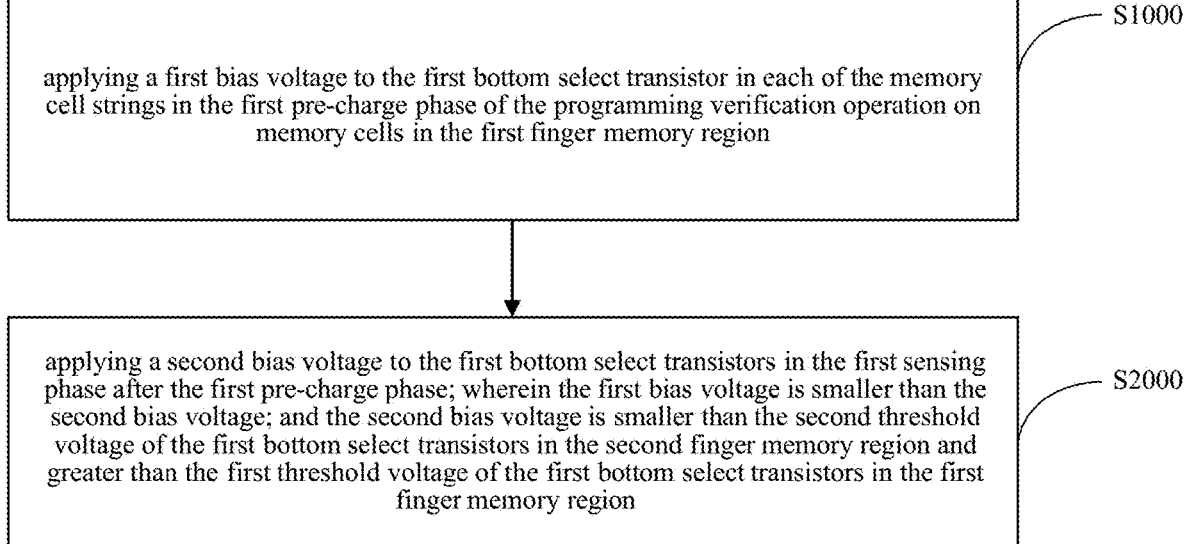

S1000 applying a first bias voltage to the first bottom select transistor in each of the memory cell strings in the first pre-charge phase of the programming verification operation on memory cells in the first finger memory region

S2000 applying a second bias voltage to the first bottom select transistors in the first sensing phase after the first pre-charge phase; wherein the first bias voltage is smaller than the second bias voltage; and the second bias voltage is smaller than the second threshold voltage of the first bottom select transistors in the second finger memory region and greater than the first threshold voltage of the first bottom select transistors in the first finger memory region

Fig.14

MEMORY DEVICE, SYSTEM, AND OPERATING METHOD FOR FACILITATING PROGRAMMING VERIFICATION OPERATIONS

CROSS-REFERENCE TO RELATED APPLICATIONS

This application claims priority to Chinese Patent Application No. 202311295167.0, filed on Oct. 8, 2023, which is hereby incorporated by reference in its entirety.

TECHNICAL FIELD

The present disclosure relates to the field of semiconductor technology, particularly to a memory device and an operating method thereof, as well as a memory system.

BACKGROUND

In order to satisfy the demand for memory integration level, there has been proposed three-dimensional memory that includes memory cells arranged in three dimensions. However, with further improvements of memory integration level, a number of memory cells connected with a same word line in a three-dimensional memory also increases, while the efficiency of programming memory cells decreases, which will in turn affect the performance of a memory device negatively.

SUMMARY

In view of this, implementations of the present disclosure provide a memory device and an operating method thereof as well as a memory system in order to address at least one of the problems in the related fields.

In order to achieve the above-mentioned object, the technical solution of implementations of the present disclosure is implemented as follows.

In a first aspect, an implementation of the present disclosure provides a memory device including a memory array and a peripheral circuit coupled with the memory array, wherein the memory array comprises a first finger memory region and a second finger memory region each comprising a plurality of memory cell strings; each of the memory cell strings comprises a first bottom select transistor; the first bottom select transistors in the first finger memory region have a first threshold voltage, and the first bottom select transistors in the second finger memory region have a second threshold voltage; the first threshold voltage is smaller than the second threshold voltage; and the peripheral circuit are configured to:

apply a first bias voltage to the first bottom select transistors in a first pre-charge phase of a programming verification operation on memory cells in the first finger memory region;

apply a second bias voltage to the first bottom select transistors in a first sensing phase after the first pre-charge phase; wherein the first bias voltage is smaller than the second bias voltage;

and the second bias voltage is smaller than the second threshold voltage and greater than the first threshold voltage.

In some implementations, each of the memory cell strings further comprises a second bottom select transistor, the second bottom select transistors in the first finger memory region have a third threshold voltage, the second bottom select transistors in the second finger memory region have a fourth threshold voltage, and the third threshold voltage is greater than the fourth threshold voltage; and the peripheral circuit is further configured to apply a first pass voltage greater than the third threshold voltage to the second bottom select transistors in the first pre-charge phase and the first sensing phase.

In some implementations, each of the memory cell strings further comprises a third bottom select transistor, the third bottom select transistor is located between the first bottom select transistor and the second bottom select transistor and has a fifth threshold voltage; and the peripheral circuit is further configured to apply a second pass voltage greater than the fifth threshold voltage to the third bottom select transistors in the first pre-charge phase and the first sensing phase.

In some implementations, the first bias voltage is greater than or equal to a negative second pass voltage and the second bias voltage is smaller than the second pass voltage.

In some implementations, the memory array further comprises a common source line connected with each of the memory cell strings, each of the memory cell strings further comprises a fourth bottom select transistor, the fourth bottom select transistor is closer to the common source line than the first bottom select transistor and the second bottom select transistor and the fourth bottom select transistor has a sixth threshold voltage; and the peripheral circuit is further configured to apply a third pass voltage greater than the sixth threshold voltage to the fourth bottom select transistors in the first pre-charge phase and the first sensing phase.

In some implementations, the first bias voltage is greater than or equal to a negative third pass voltage and the second bias voltage is smaller than the third pass voltage.

In some implementations, the peripheral circuit is further configured to:

apply a fourth pass voltage greater than the second threshold voltage to the first bottom select transistors and apply a third bias voltage to the second bottom select transistors in a second pre-charge phase of a programming verification operation on memory cells in the second finger memory region;

apply the fourth pass voltage to the first bottom select transistors and apply a fourth bias voltage to the second bottom select transistors in a second sensing phase after the second pre-charge phase; wherein the third bias voltage is smaller than the fourth bias voltage; and the fourth bias voltage is smaller than the third threshold voltage and greater than the fourth threshold voltage.

In some implementations, each of the memory cell strings further comprises a top select transistor; and the peripheral circuit is further configured to:

turn on the top select transistors in the first finger memory region in the first pre-charge phase;

turn off unselected top select transistors in the first finger memory region in the first sensing phase and turn on selected top select transistors in the first finger memory region; and turn off the top select transistors in the second finger memory region in the first pre-charge phase and the first sensing phase.

In the second aspect, an implementation of the present disclosure provides a memory system including:

at least one of the memory device as described in any of the above implementations; and

a controller coupled with the at least one memory device and configured to control the memory device.

In the third aspect, an implementation of the present disclosure provides an operating method of a memory device, including:

applying a first bias voltage to a first bottom select transistor in each memory cell string in a first pre-charge phase of a programming verification operation on memory cells in a first finger memory region;

applying a second bias voltage to the first bottom select transistors in a first sensing phase after the first pre-charge phase; wherein the first bias voltage is smaller than the second bias voltage; and the second bias voltage is smaller than a second threshold voltage of the first bottom select transistors in a second finger memory region and greater than a first threshold voltage of the first bottom select transistors in the first finger memory region.

In some implementations, the operating method further comprises:

applying a first pass voltage to a second bottom select transistor in each of the memory cell strings in the first pre-charge phase and the first sensing phase, the second bottom select transistors in the first finger memory region have a third threshold voltage greater than a fourth threshold voltage of the second bottom select transistors in the second finger memory region, and the first pass voltage is greater than the third threshold voltage.

In some implementations, the operating method further comprises:

applying a second pass voltage to third bottom select transistors between the first bottom select transistors and the second bottom select transistors in the first pre-charge phase and the first sensing phase, wherein the second pass voltage is greater than a fifth threshold voltage of the third bottom select transistors.

In some implementations, the first bias voltage is greater than or equal to a negative second pass voltage and the second bias voltage is smaller than the second pass voltage.

In some implementations, the operating method further comprises:

applying a third pass voltage to fourth bottom select transistors closer to the common source line than the first bottom select transistors and the second bottom select transistors in the first pre-charge phase and the first sensing phase, wherein the third pass voltage is greater than a sixth threshold voltage of the fourth bottom select transistors.

In some implementations, the first bias voltage is greater than or equal to a negative third pass voltage and the second bias voltage is smaller than the third pass voltage.

In some implementations, the operating method further comprises:

applying a fourth pass voltage greater than the second threshold voltage to the first bottom select transistors and applying a third bias voltage to the second bottom select transistors in a second pre-charge phase of a programming verification on memory cells in the second finger memory region;

applying the fourth pass voltage to the first bottom select transistors and applying a fourth bias voltage to the second bottom select transistors in a second sensing phase after the second pre-charge phase; wherein the third bias voltage is smaller than the fourth bias voltage; and the fourth bias voltage is smaller than the third threshold voltage and greater than the fourth threshold voltage.

In some implementations, the operating method further comprises:

turning on top select transistors in the first finger memory region in the first pre-charge phase;

turning off unselected top select transistors in the first finger memory region in the first sensing phase and turning on selected top select transistors in the first finger memory region; and turning off the top select transistors in the second finger memory region in the first pre-charge phase and the first sensing phase.

In the technical solution provided in the present disclosure, the memory array in the memory device comprises a first finger memory region and a second finger memory region divided on the basis of threshold voltages of the first bottom select transistors and the periphery circuits are configured to apply a first bias voltage to the first bottom select transistors in the pre-charge phase of the programming verification operation of the memory cells in the first finger memory region and apply a second bias voltage to the first bottom select transistors in a sensing phase after the pre-charge phase, wherein the first bias voltage is lower than the second bias voltage. Therefore, it is possible to suppress the trend of upward shifting of the voltage on the first bottom select transistors due to the coupling effect, which allows the actual voltage on the first bottom select transistors to be stabilized at nearly the second bias voltage and allows the first bottom select transistors in the second finger memory region remain in off-state, thereby reducing shifting of threshold voltage of the memory cell in the second finger memory region due to the hot carrier injection effect. Therefore, it is possible to improve the efficiency of programming verification operation and further improve the efficiency and reliability of the programming operation.

BRIEF DESCRIPTION OF DRAWINGS

FIG. 14 is a flow diagram of an operating method of a memory device provided in an implementation of the present disclosure.

DETAILED DESCRIPTION

Figure 1:
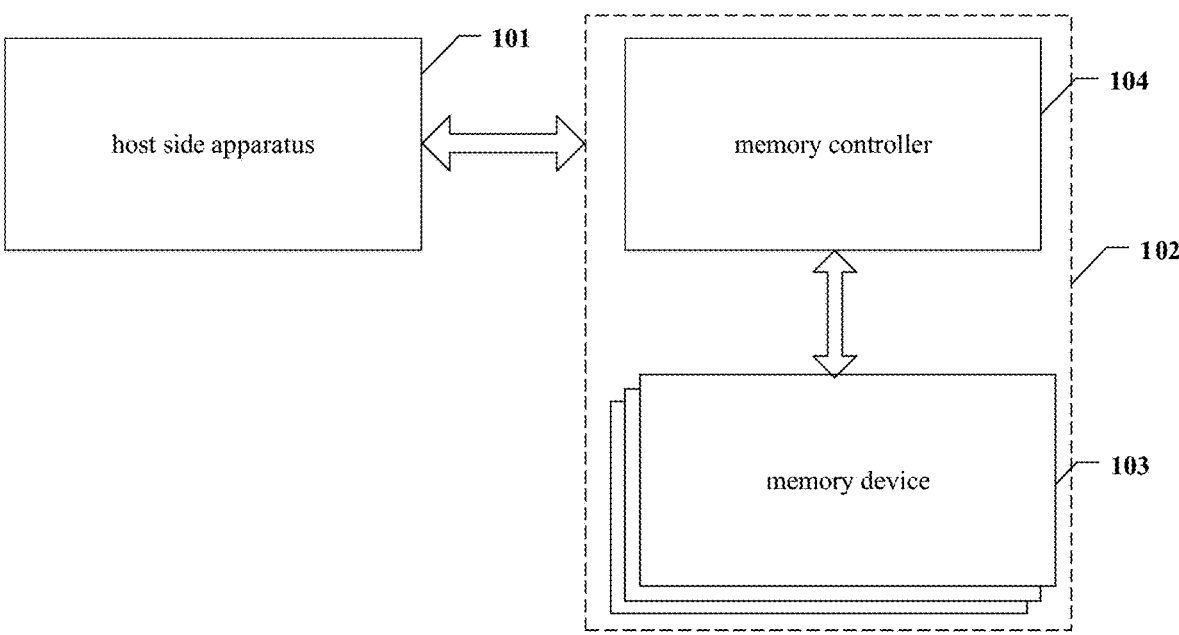
FIG. 1 is a diagram of an example system having a memory system provided in an implementation of the present disclosure.

Example implementations of the present disclosure will be described in greater detail below with reference to the accompanying drawings. Although example implementations of the present disclosure are shown in drawings, it is to be appreciated that the present disclosure may be implemented in various forms rather than being limited to the specific implementations as set forth herein. In contrast, these implementations are provided to understand the present disclosure more thoroughly and convey the scope of the present disclosure completely to those skilled in the art.

In the following description, a large amount of specific details is presented to provide thorough understanding of the present disclosure. However, it is obvious to one skilled in the art that the present disclosure may be implemented without one or more of these details. In other examples, in order to avoid confusion with the present disclosure, some technical features well known in the art are not described. That is, not all features of the practical implementations are described herein, and well-known functions and structures are not described.

In the drawings, the same reference numerals refer to the same elements throughout the specification.

It is appreciated that spatial relationship terms such as "under", "below", "beneath", "over", "on" etc. may be used herein for convenient description to describe the relationship of one element or feature relative to other elements or features shown in the drawings. It is to be appreciated that spatial relationship terms are further intended to include different orientations of devices in use and operation in addition to orientations shown in the figures. For example, if the device in a figure is flipped over, then an element or feature described as "under" or "below" or "beneath" another element or feature will be oriented as "on" the other element or feature. Accordingly, example terms "under" and "below" may include two orientations "on" and "under". A device may be otherwise oriented (rotated by 90 degrees or other orientations) and spatial description terms used herein should be interpreted accordingly.

Terms are used herein only for describing specific implementations rather than limiting the present disclosure. As used herein, the singular form "a", "an" and "the" are also intended to include the plural form unless otherwise stated in the context. It is also understood that while used in the description, terms "consist" and/or "include" confirm the presence of said features, integers, steps, operations, elements and/or components, but do not exclude the presence or addition of one or more other features, integers, steps, operations, elements, components and/or combination thereof. As used herein, the term "and/or" includes any and all combinations of relevant listed items.

FIG. 1 is a diagram of an example system having a memory device provided in an implementation of the present disclosure. In implementations of the present disclosure, the system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 may include a host side apparatus 101 and a memory system 102 including one or more memory devices 103 and a memory controller 104. The host side apparatus 101 may include a processor of the electronic apparatus such as a central processing unit (CPU) or a system-on-chip (SoC) such as an application processor (AP). The host side apparatus 101 may be configured to send data to the memory system 102 or receive data from the memory system 102.

In some implementations, the memory controller 104 is coupled to the memory device 103 and the host side apparatus 101 and is configured to control the memory device 103. The memory controller 104 can manage the data stored in the memory device 103 and communicate with the host side apparatus 101. In some implementations, the memory controller 104 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other implementations, the memory controller 104 is designed for operating in a high duty-cycle environment such as solid state disk (SSD) or embedded multi Media Card (eMMC).

The memory controller 104 can be configured to control operations of the memory device 103, such as read, erase, and program operations. The memory controller 104 can also be configured to manage various functions with respect to the data stored or to be stored in the memory device 103 including, but not limited to bad-block management, garbage recycling, logical-to-physical address conversion, wear leveling, etc. In some implementations, the memory controller 104 is further configured to process error correction codes with respect to the data read from or written to the memory device 103. Any other suitable functions may be performed by the memory controller 104 as well, for example, formatting the memory device 103.

In some implementations, the memory controller 104 and the one or more memory devices 103 may be integrated into various memory apparatuses. That is, the memory system 102 can be implemented and packaged into different types of end electronic products.

Figure 2:
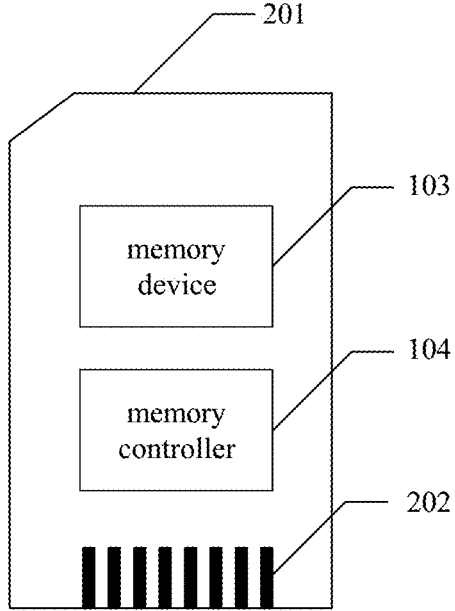
FIG. 2 is a diagram of an example memory card having a memory system provided in an implementation of the present disclosure.
Figure 3:
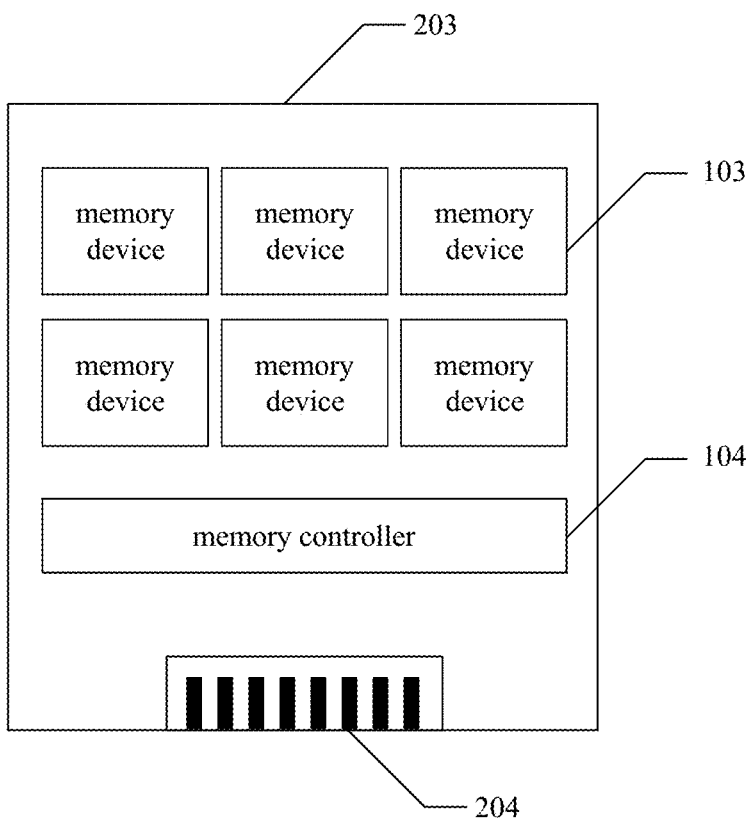
FIG. 3 is a diagram of an example solid state disk having a memory system provided in an implementation of the present disclosure.

In one example as shown in FIG. 2, the memory controller 104 and a single memory device 103 can be integrated into a memory card 201. The memory card 201 may be one of a compact flash card, a smart media card (SMC), a memory stick (MS), a multi-media card (MMC) such as a RS-MMC, a MMCmicro and an eMMC etc., a secure digital card such as a Mini SD card, a Micro SD card, a SDHC card etc., and a universal flash storage (UFS) card. The memory card 201 may also include a memory card connector 202 coupling the memory card 201 and the host side apparatus (e.g., the host side apparatus 101 in FIG. 1). In another example as shown in FIG. 3, the memory controller 104 and the plurality of memory devices 103 may be integrated into a SSD 203. The SSD 203 may also include a SSD connector 204 coupling the SSD 203 and the host side apparatus (e.g., the host side apparatus 101 in FIG. 1). In some implementations, the memory capacity and/or operating speed of SSD 203 are greater than the memory capacity and/or operating speed of the memory card 201.

Figure 4:
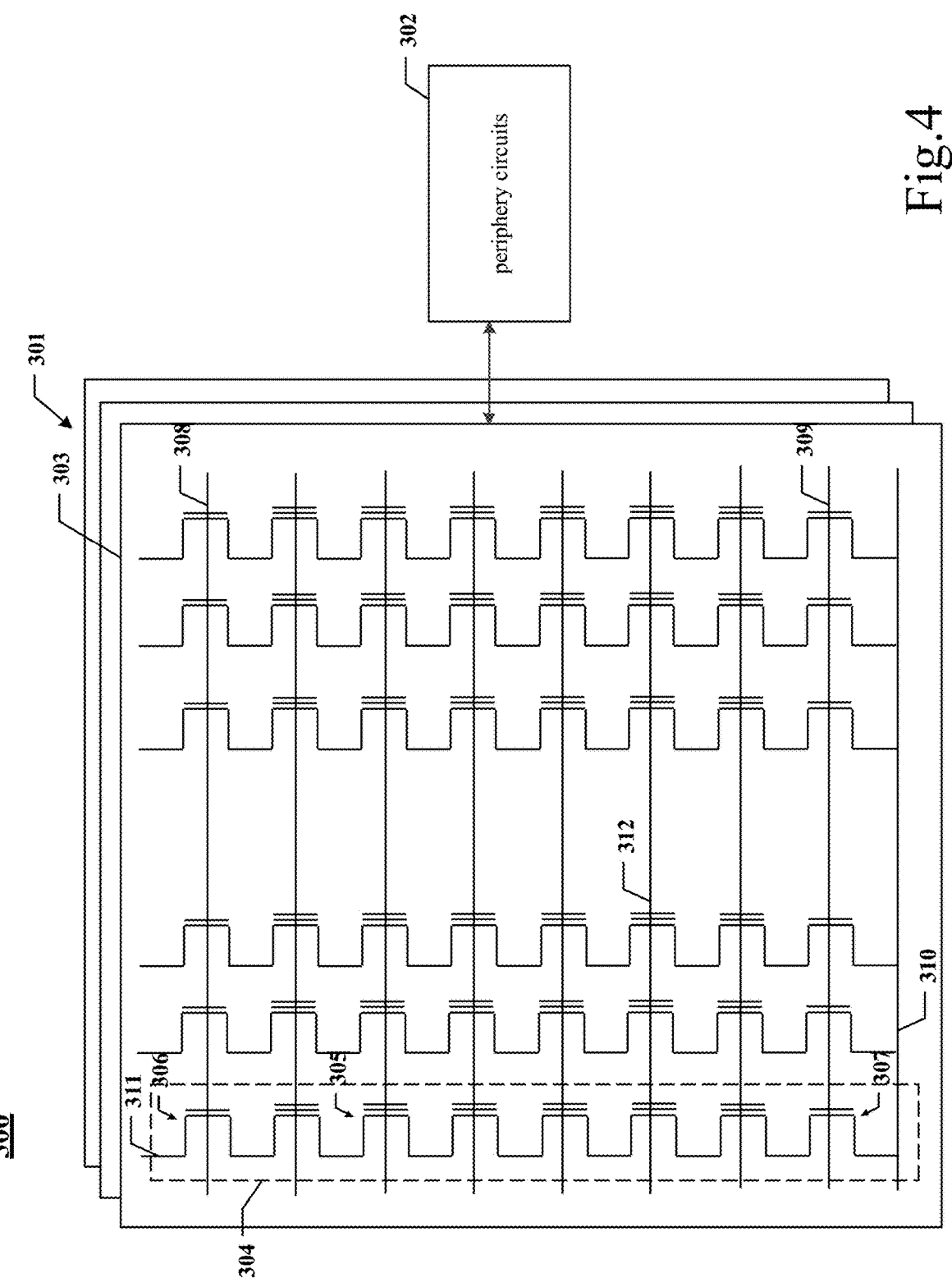
FIG. 4 is a diagram of an example memory device including a peripheral circuit provided in an implementation of the present disclosure.

FIG. 4 is a circuit diagram of an example memory device 300 including a peripheral circuit provided in some implementations. The memory device 300 may be an example of the memory device 103 in FIG. 1. The memory device 300 may include a memory array 301 and a peripheral circuit 302 coupled to the memory array 301. Taking an example in which the memory array 301 is a three-dimensional NAND memory array for explanation, the memory cells 305 are NAND memory cells and provided in the form of an array of memory cell strings 304 and each of the memory cell strings 304 extends vertically over the substrate (not shown). In some implementations, each memory cell string 304 includes a plurality of memory cells 305 coupled in series and stacked vertically. Each memory cell 305 can retain continuous analog values, for example, voltages or charges, depending on the number of electrons trapped in the region of the memory cell 305. Each memory cell 305 may be a memory cell of a floating-gate type that includes floating-gate transistors or a memory cell of a charge trapping type that includes charge trapping transistors.

In some implementations, each memory cell 305 is a single-level cell (SLC) that has two possible memory states and can therefore store one bit of data. For example, the first memory state "0" may correspond to the first voltage range, and the second memory state "1" may correspond to the second voltage range. In some implementations, each memory cell 303 is a multi-level cell that can store more than one bit of data in four or more than four memory states, such as a multi-level cell (MLC) storing two bits per cell, a triple level cell (TLC) storing three bits per cell or a quad-level cell (QLC) storing four bits per cell.

As illustrated in FIG. 4, each memory cell string 304 may include a bottom select transistor (BSG) 307 at its source side and a top select transistor (TSG) 306 at its drain side. The bottom select transistor 307 and the top select transistor 306 may be configured to activate selected memory cell strings 304 during reading and programming operations. In some implementations, sources of the memory cell strings 304 in the same memory block 303 may be coupled together through the common source line (CSL) 310. In other words, all memory cell strings 304 in the same memory block 303 have an array common source (ACS). According to some implementations, the top select transistor 306 of each memory cell string 304 is coupled to a corresponding bit line (BL) 311 and data may be read from or written into the bit line 311 via an output bus (not shown). In some implementations, each memory cell string 304 is configured to apply a selection voltage (e.g., a voltage higher than the threshold voltage of the top select transistor 306) or a deselection voltage (e.g., OV) to a corresponding top select transistor 306 via one or more top select lines (TSL) 308 and/or apply a selection voltage (e.g., a voltage higher than the threshold voltage of the bottom select transistor 307) or a deselection voltage (e.g., OV) to a corresponding bottom select transistor 307 via one or more bottom select lines (BSL) 309 such that they are selected or deselected.

As shown in FIG. 4, a memory cell string 304 may be organized into a plurality of memory blocks 303 each of which may have a common source line (CSL) 310. In some implementations, each memory block 303 is the basic data unit for erase operation. That is, all memory cells 305 on the same memory block 303 are erased at the same time. In order to erase the memory cells 305 in a selected memory block, it is possible to bias the common source line 310 coupled to the selected memory block and the unselected memory blocks in the same plane as the selected memory block with an erase voltage. It will be appreciated that in some examples, it is possible to execute erase operation on the semi-memory block level, the quarter-memory block level or a level of any suitable number of memory blocks or any suitable fraction of a memory block. Memory cells 305 in adjacent memory cell strings 304 may be coupled via the word line 312 that chooses which row of the memory cells 305 is affected by the reading or programming operations.

Figure 5:
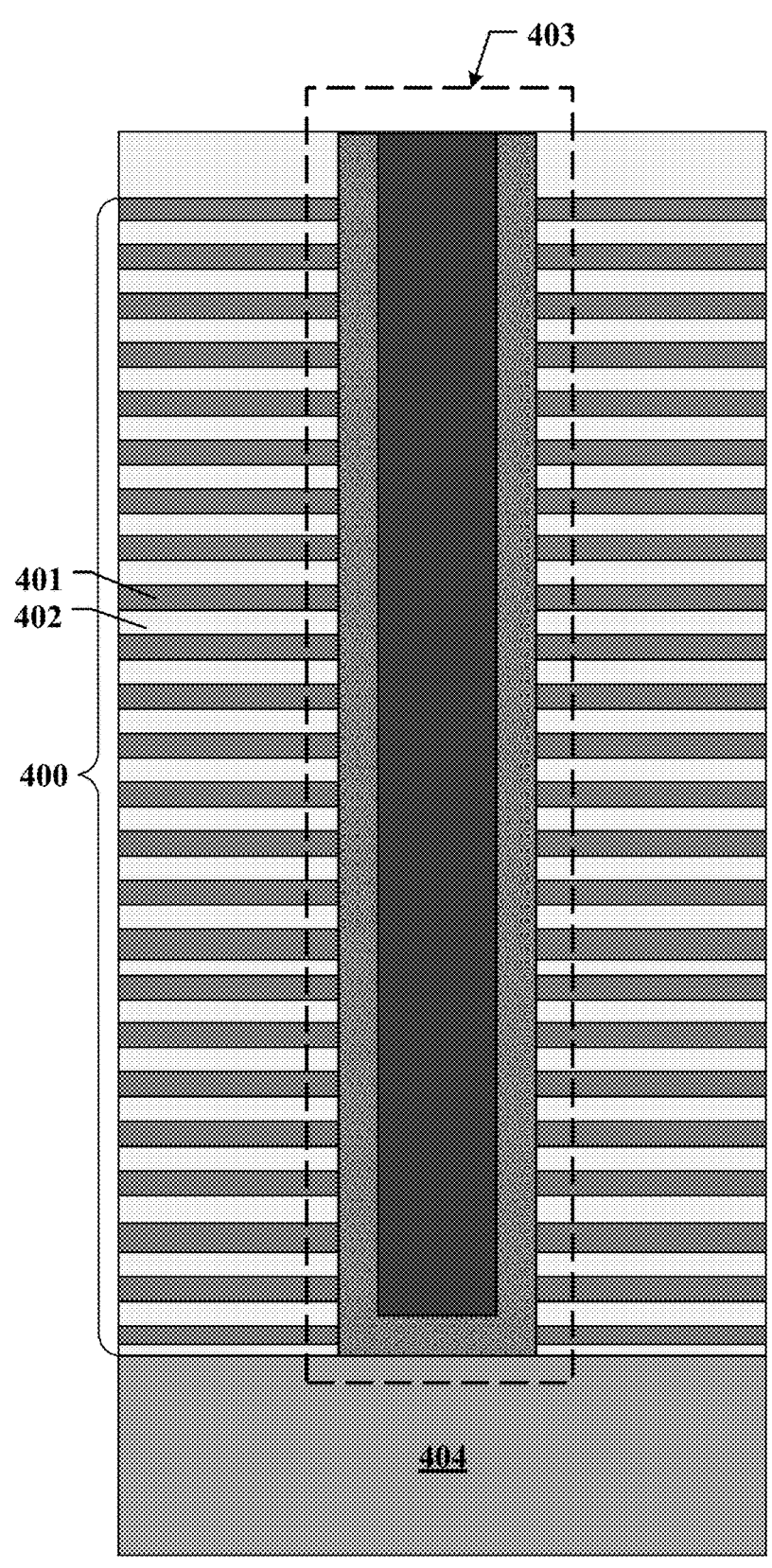
FIG. 5 is a sectional diagram of a memory array including memory cell strings provided in an implementation of the present disclosure.

FIG. 5 is a sectional diagram of a memory array including memory cell strings provided in an implementation of the present disclosure. As shown in FIG. 5, the memory array may include a stack structure 400 including a plurality of gate layers 401 and a plurality of insulating layers 402 stacked alternatively and a channel structure 403 penetrating through the gate layers 401 and the insulating layers 402 vertically. The gate layers 401 and the insulating layers 402 may be stacked alternatively and adjacent two gate layers 401 are separated by one insulating layer 402. The number of memory cells included in the memory array is primarily related to the number of pairs of gate layers 401 and insulating layers 402 in the stack structure 400.

The composition materials of the gate layers 401 may include conductive materials. The conductive materials include, but not limited to tungsten (W), cobalt (Co), copper (Cu), aluminum (Al), polysilicon, doped silicon, silicide or any combination thereof. In some implementations, each gate layer 401 includes a metal layer such as a tungsten layer. In some implementations, each gate layer 401 includes a doped polysilicon layer. A plurality of gate layers 401 surround a channel structure 403 to form a memory cell string. The gate layer 401 on top of the stack structure 400 may extend laterally as a top select line, the gate layer 401 at the bottom of the stack structure 400 may extend laterally as a bottom select line, and the gate layer 401 extending laterally between the top select line and the bottom select line may serve as a word line layer.

In some implementations, the stack structure 400 may be disposed on the substrate 404. The substrate 404 may include silicon (e.g., single crystalline silicon), silicon germanium (SiGe), gallium arsenide (GaAs), germanium (Ge), silicon-on-insulator (SOI), germanium-on-insulator (GOI) or any other suitable material.

In some implementations, the channel structure 403 includes a function layer, a channel layer and an insulating filling layer. In some implementations, the channel layer includes silicon, such as polysilicon. In some implementations, the function layer is a composite dielectric layer including a tunneling layer, a storage layer (also known as "charge trapping/storage layer") and a barrier layer. The channel structure 403 may have a cylindrical shape (e.g., a pillar shape). According to some implementations, the channel layer, the tunneling layer, the storage layer and the barrier layer are arranged radially from the center of the pillar towards the outer surface in this order. The tunneling layer may include silicon oxide, silicon oxynitride or any combination thereof. The storage layer may include silicon nitride, silicon oxynitride or any combination thereof. The barrier layer may include silicon oxide, silicon oxynitride, high dielectric constant (high-k) dielectric or any combination thereof. In one example, the function layer may include a composite layer of silicon oxide/silicon oxynitride/silicon oxide (ONO).

Figure 6:
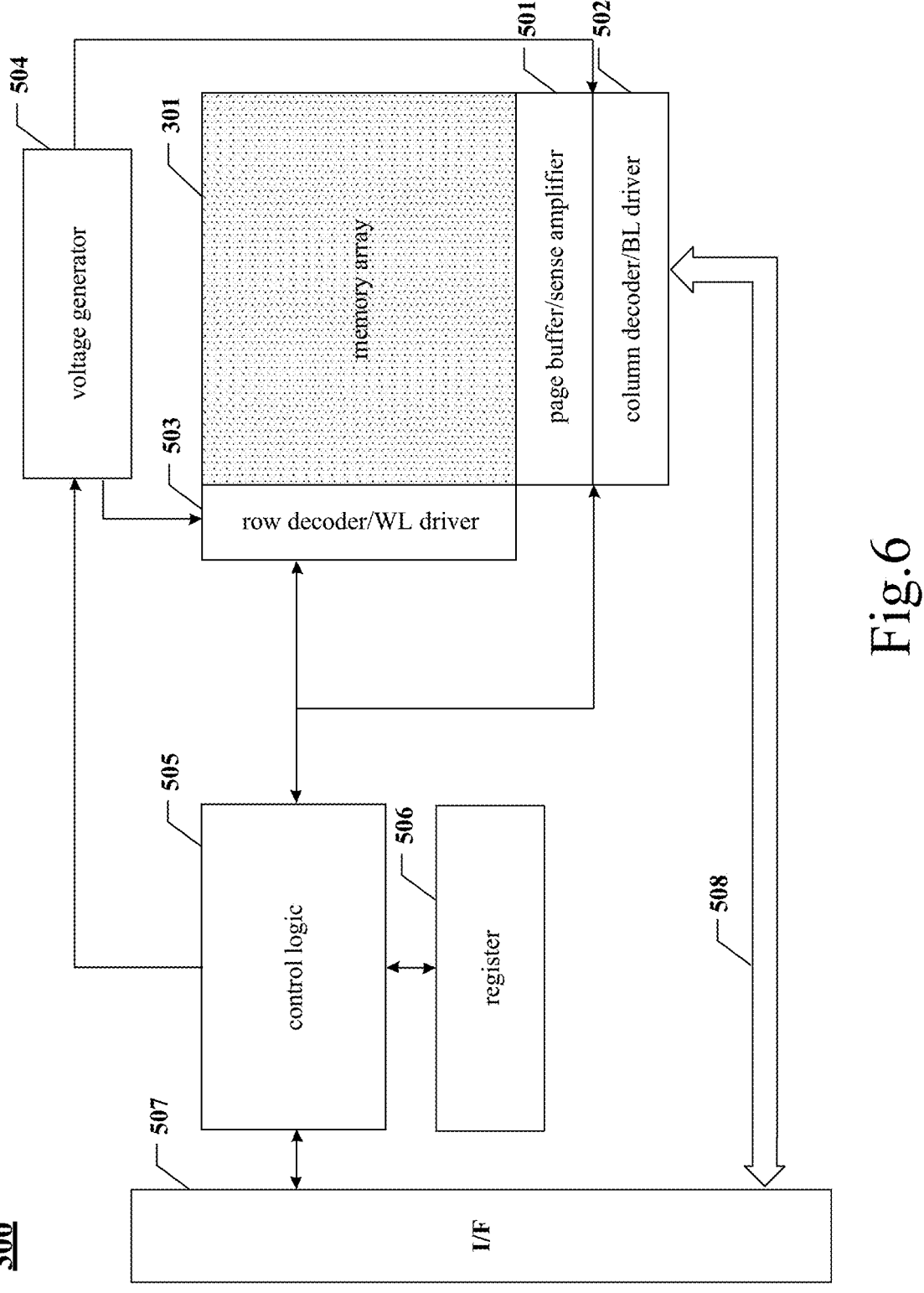
FIG. 6 is a diagram of an example memory device including a memory array and a peripheral circuit provided in an implementation of the present disclosure.

Referring back to FIG. 4, the peripheral circuit 302 may be coupled to the memory array 301 through the bit line 311, the word line 312, the common source line 310, the bottom select line 309 and the top select line 308. The peripheral circuit 302 may include any suitable analog, digital and hybrid signal circuits for performing operations on the memory array 301 by applying voltage signals and/or current signals to each target memory cell 305 and sensing voltage signals and/or current signals from each target memory cell 305 via bit line 311, word line 312, common source line 310, bottom select line 309 and top select line 308. The peripheral circuit 302 may include various types of peripheral circuit formed using metal-oxide-semiconductor technologies. For example, FIG. 6 illustrates some example peripheral circuit. The peripheral circuit 302 include a page buffer/sense amplifier 501, a column decoder/bit line driver 502, a row decoder/word line driver 503, a voltage generator 504, a control logic 505, a register 506, a flash interface 507, and a data bus 508. It should be understood that in some examples, additional peripheral circuit not shown in FIG. 6 may be further included.

The page buffer/sense amplifier 501 may be configured to read and program (write) data from/to the memory array 301 according to control signals from control logic 505. In one example, the page buffer/sense amplifier 501 may store a page of programming data (writing data) to be programed into the memory array 301. In another example, the page buffer/sense amplifier 501 may perform programming verification operation to ensure that data has been correctly programmed into memory cells coupled to the selected word line. In yet another example, the page buffer/sense amplifier 501 may also sense a low-power signal from a bit line indicating the data bit stored in a memory cell and amplify a small voltage swing to an identifiable logic level in reading operation. The column decoder/bit line driver 502 may be configured to be controlled by the control logic 505 and select one or more memory cell strings by applying a bit line voltage generated by the voltage generator 504.

The row decoder/word line driver 503 may be configured to be controlled by the control logic 505, and select/deselect memory blocks of the memory array 301 and select/deselect word lines for the memory blocks. The row decoder/word line driver 508 may be further configured to drive the word lines using word line voltages generated by the voltage generator 504. In some implementations, the row decoder/word line driver 503 may also select/deselect and drive bottom select lines and top select lines. As described in detail below, the row decoder/word line driver 503 is configured to perform programming operation on memory cells coupled to (one or more) selected word lines. The voltage generator 504 may be configured to be controlled by the control logic 505 and generate the word line voltages (such as read voltage, program voltage, pass voltage, local voltage and verification voltage etc.), the bit line voltage and source line voltages to be supplied to the memory array 301.

The control logic 505 may be coupled to each peripheral circuit described above and configured to control operations of each peripheral circuit. The register 506 may be coupled to the control logic 505 and include a status register, a command register and an address register for storing status information, command operation codes (OP codes) and command addresses for controlling operations of each of the peripheral circuit. The flash interface 507 may be coupled to the control logic 505, and serve as a control buffer to buffer control commands received from the host side apparatus (not shown) and relay them to the control logic 505, and buffer status information received from the control logic 505 and relay them to the memory controller. The flash interface 507 may be further coupled to the column decoder/bit line driver 502 via the data bus 508 and serve as a data I/O interface and a data buffer to buffer data and relay it to the memory array 301 or relay or buffer data from the memory array 301.

With the further increased integration degree of memory devices, the density of memory arrays increases continuously, and the number of the memory cells connected with the same word line also increases accordingly. While one or more memory cells need to be selected for programming operation, the coupling effect between a memory cell string where unselected memory cells connected with the selected word line are located and the selected word line would cause an extended voltage establishment time on the selected word line, thereby leading to a reduced programming efficiency. Whereas the current required for the selected word line to reach a target voltage is increased, causing an increased peak current during the programming operation and an increased power consumption of the memory device.

In view of this, implementations of the present disclosure provide a memory device including a memory array and a peripheral circuit coupled with the memory array.

Figure 7:
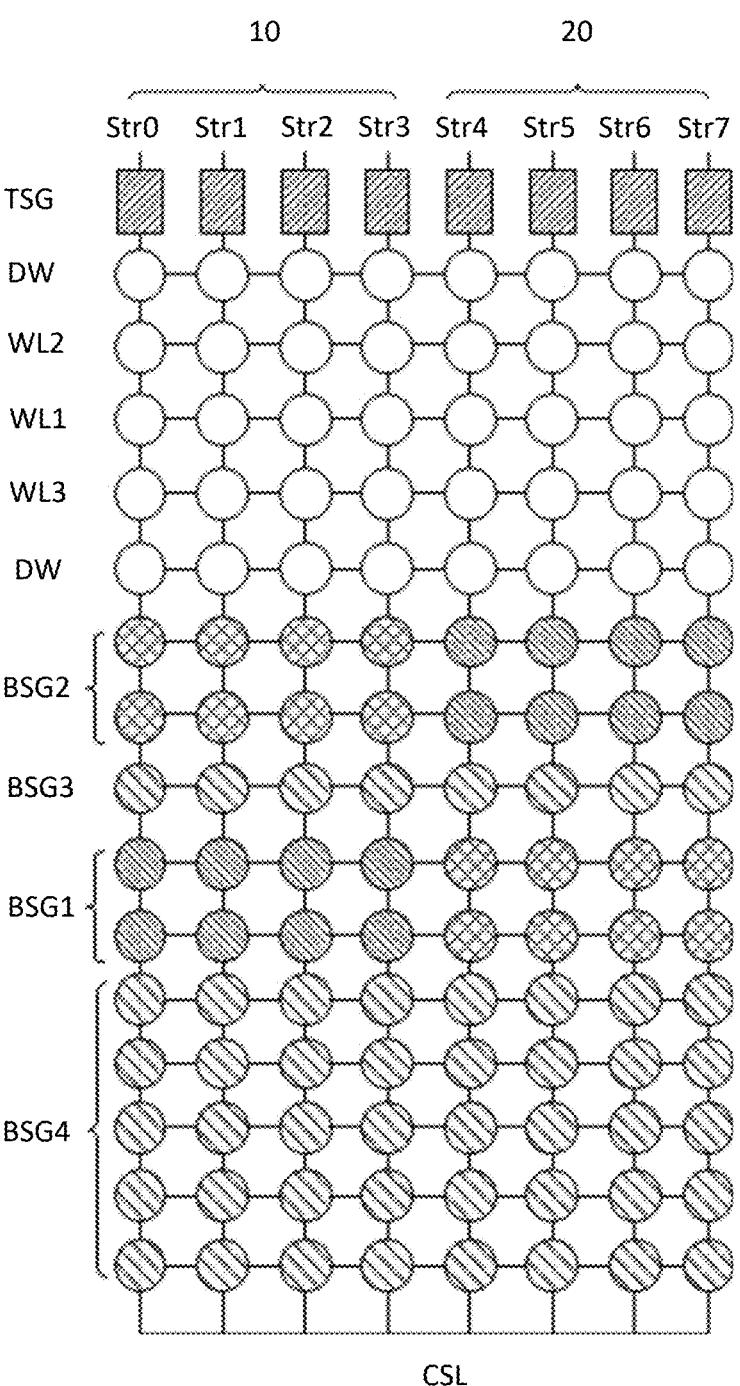
FIG. 7 is a diagram of a memory array in a memory device provided in an implementation of the present disclosure.

FIG. 7 is a diagram of a memory array provided in an example of the present disclosure. As shown in FIG. 7, the memory array includes a first finger memory region 10 and a second finger memory region 20 connected with the common source line CSL. Each of the first finger memory region 10 and the second finger memory region 20 includes a plurality memory cell strings. For example, the first finger memory region 10 includes memory cell strings Str0, Str1, Str2 and Str3 and the second finger memory region 20 includes memory cell strings Str4, Str5, Str6 and Str7.

It is to be noted that FIG. 7 only shows an example in which the memory array includes two finger memory regions and each of the finger memory regions includes four memory cell strings, but the present disclosure is not limited thereto. In some other implementations, the memory array may include more than two finger memory regions and each of the finger memory regions may include more than four memory cell strings. The number of the finger memory regions in the memory array and the number of the memory cell strings in each finger memory region are not limited in the present disclosure.

Referring back to FIG. 7, in the implementation of the present disclosure, each memory cell string includes a plurality of bottom select transistors, namely a first bottom select transistor BSG1, a second bottom select transistor BSG2, a third bottom select transistor BSG3 and a fourth bottom select transistor BSG4. Gates of the bottom select transistors in the same row are connected with the same bottom select line, that is, the periphery circuits may apply voltages to the bottom select transistors in the same row via the bottom select line.

In some implementations, each memory cell string further includes a top select transistor TSG and memory cells connected with a word line WL1, a word line WL2 and a word line WL3, as well as a dummy memory cell connected with a dummy word line DW.

It is to be noted that the number of the first bottom select transistor BSG1, the second bottom select transistor BSG2, the third bottom select transistor BSG3 and the fourth bottom select transistor BSG4, the number of the top select transistor TSG, and the number of the word lines and dummy word lines in FIG. 7 are only examples and specific numbers of these structures are not limited herein.

In some implementations, the first bottom select transistors BSG1 in the first finger memory region 10 have a first threshold voltage Vt1, the first bottom select transistors BSG1 in the second finger memory region 20 have a second threshold voltage Vt2, and the first threshold voltage Vt1 is smaller than the second threshold voltage Vt2.

In some implementations, the second bottom select transistors BSG2 in the first finger memory region 10 have a third threshold voltage Vt3, the second bottom select transistors BSG2 in the second finger memory region 20 have a fourth threshold voltage Vt4, and the third threshold voltage Vt3 is greater than the fourth threshold voltage Vt4.

Figure 8:
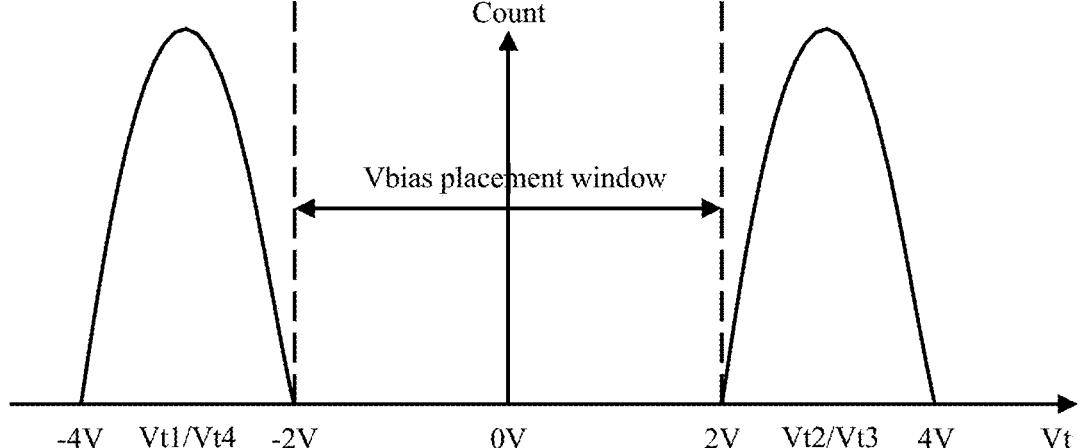
FIG. 8 is a diagram of threshold voltage distributions of a first bottom select transistor and a second bottom select transistor provided in an implementation of the present disclosure.

In an example, as shown in FIG. 8, the first threshold voltage Vt1 and the fourth threshold voltage Vt4 may be in a range of −4V to −2V, and the second threshold voltage Vt2 and the third threshold voltage Vt3 may be in a range of 2V to 4V. When only memory cell strings in the first finger memory region 10 need to be turned on, it is possible to apply a bias voltage to the first bottom select transistors BSG1 and apply a pass voltage to other bottom select transistors. In particular, the bias voltage may have any value in the range of −2V to 2V. The first bottom select transistors BSG1 in the first finger memory region 10 have a first threshold voltage Vt1 lower than the bias voltage, and the first bottom select transistors BSG1 in the second finger memory region 20 have a second threshold voltage Vt2 higher than the bias voltage. As such, the first bottom select transistors BSG1 in the first finger memory region 10 are turned on, the first bottom select transistors BSG1 in the second finger memory region 20 are turned off, and other bottom select transistors are turned on. Therefore, the memory cell strings in the second finger memory region 20 may be in the floating state such that operations can be only performed on the memory cells in the first finger memory region 10. Similarly, when only memory cell strings in the second finger memory region 20 need to be turned on, it is possible to apply the bias voltage to the second bottom select transistors BSG2 and apply a pass voltage to other bottom select transistors. Then the second bottom select transistors BSG2 in the first finger memory region 10 have the third threshold voltage Vt3 higher than the bias voltage, and the second bottom select transistors BSG2 in the second finger memory region 20 have the fourth threshold voltage Vt4 lower than the bias voltage. As such the second bottom select transistor BSG2 in the first finger memory region 10 are turned off, the second bottom select transistors BSG2 in the second finger memory region 20 are turned on, and other bottom select transistors are turned on. Therefore, the memory cell strings in the first finger memory region 10 may be in the floating state such that operations can be only performed on the memory cells in the second finger memory region 20.

In the above-described examples, the first bottom select transistors BSG1 in the same row have two different threshold voltages. Correspondingly, the second bottom select transistors BSG2 in the same row also have two different threshold voltages. Therefore, the memory array can be divided into the first finger memory region 10 and the second finger memory region 20 and the first finger memory region 10 and the second finger memory region 20 can be operated separately by applying the bias voltage to the first bottom select transistors BSG1 or applying the bias voltage to the second bottom select transistors BSG2. That is, it is possible to select only one finger memory region, while memory cell strings in the unselected finger memory region may be in a floating state. Therefore, it is possible to mitigate the coupling effect by the unselected memory cell strings on the selected word line, reduce the establishment time of voltage on the word line and reduce the peak current, thereby reducing power consumption of the memory device while improving operation efficiency.

In some implementations, each of the memory cell strings includes a third bottom select transistor BSG3 between the first bottom select transistor BSG1 and the second bottom select transistor BSG2 and a fourth bottom select transistor BSG4 closer to the common source line CSL than the first bottom select transistor BSG1 and the second bottom select transistor BSG2. The third bottom select transistors BSG3 in both the first finger memory region 10 and the second finger memory region 20 have a fifth threshold voltage Vt5, and the fourth bottom select transistors BSG4 in both the first finger memory region 10 and the second finger memory region 20 have a sixth threshold voltage Vt6.

In some examples, before performing programming operation on a memory cell, a programming operation may be performed on the first bottom select transistors BSG1 and the second bottom select transistors BSG2 to program the first bottom select transistors BSG1 and the second bottom select transistors BSG2 in the first finger memory region 10 to the first threshold voltage Vt1 and the third threshold voltage Vt3 respectively, and program the first bottom select transistors BSG1 and the second bottom select transistors BSG2 in the second finger memory region 20 to the second threshold voltage Vt2 and the fourth threshold voltage Vt4 respectively. In this process, the third bottom select transistors BSG3 between the first bottom select transistors BSG1 and the second bottom select transistors BSG2 can function to buffer the electric field between the first bottom select transistors BSG1 and the second bottom select transistors BSG2 during the programming verification operation and the fourth bottom select transistors BSG4 can function to turn off the bottom during the programming operation.

Figure 9:
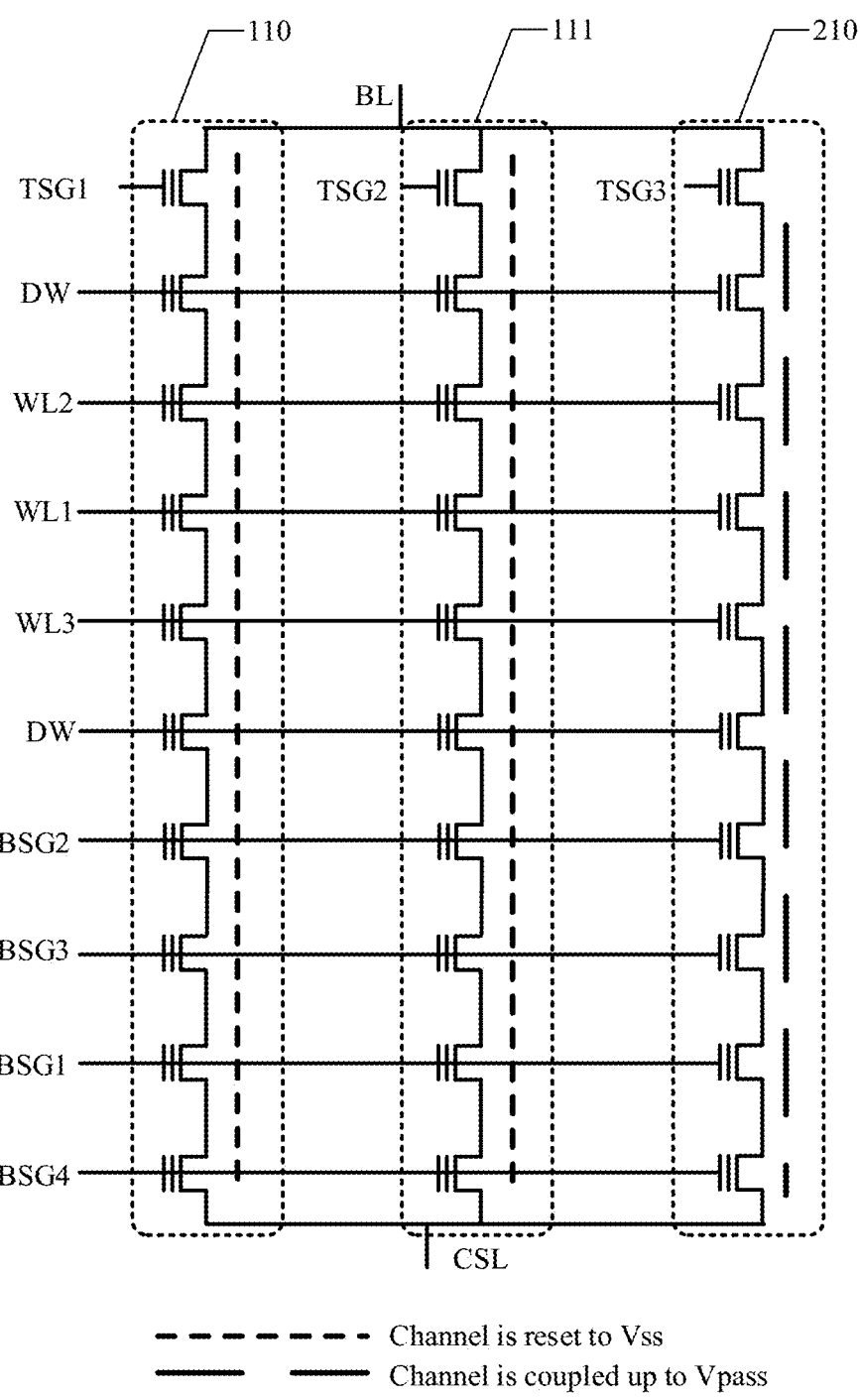
FIG. 9 is a circuit diagram I of a memory array provided in an implementation of the present disclosure.
Figure 10:
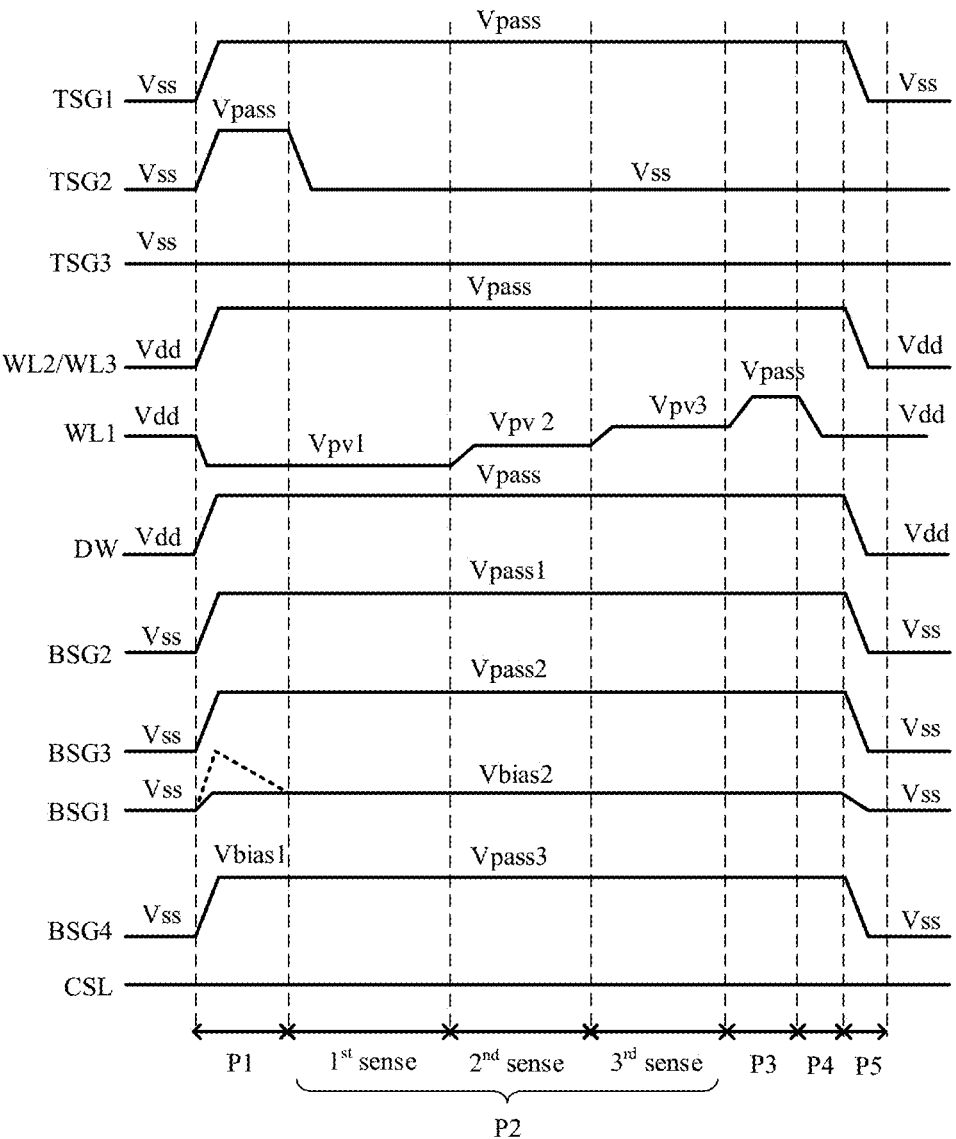
FIG. 10 is a voltage graph I of performing a programming verification operation on memory cells in a first finger memory region as provided in an implementation of the present disclosure.

In an example, FIG. 9 is a simplified circuit diagram corresponding to the memory array shown in FIG. 7, and FIG. 10 is a voltage graph when a programming verification operation is performed on the memory cells in the first finger memory region 10.

Referring to FIGS. 7 and 9 in combination, the memory cell string 110 and the memory cell string 111 may be any two memory cell strings in the first finger memory region 10, wherein the memory cell string 110 is the memory cell string where memory cells to be subjected to the programming verification operation are located, that is, the memory cell string 110 is the selected memory cell string in the selected finger memory region which includes a top select transistor TSG1, and the memory cell string 111 is the unselected memory cell string in the selected finger memory region, which includes a top select transistor TSG2. The memory cell string 210 may be any memory cell string in the second finger memory region 20. The memory cell string 210 is the unselected memory cell string in the unselected finger memory region, which includes a top select transistor TSG3. Here, the gates of the top select transistors TSG1, TSG2 and TSG3 are connected with three different top select lines respectively.

In implementations of the present disclosure, the word line WL1 is the selected word line, the word lines WL2 and WL3 are unselected word lines. In some other implementations, the word line WL2 or word line WL3 may also be the selected word line.

In some implementations, as shown in FIG. 10, the programming verification operation performed on the selected memory cells in the first finger memory region 10 includes a first pre-charge phase P1 and a first sensing phase P2. The first sensing phase P2 is a phase after the first pre-charge phase P1 in which multiple sensing operations are performed on the selected memory cells in the first finger memory region 10.

In some implementations, in the first pre-charge phase P1, the peripheral circuit is configured to: apply a pass voltage Vpass to the top select transistors in the first finger memory region 10 to turn on the top select transistors in the first finger memory region 10, that is, the top select transistor TSG1 in the memory cell string 110 and the top select transistor TSG2 in the memory cell string 111 are both turned on; apply a ground voltage Vss to the top select transistors in the second finger memory region 20 to turn off the top select transistors in the second finger memory region 20, that is, the top select transistor TSG3 in the memory cell string 210 is turned off; apply a pass voltage Vpass to the unselected word line WL2/WL3 and the dummy word line DW; apply a first pass voltage Vpass1 greater than the third threshold voltage Vt3 to the second bottom select transistors BSG2; apply a second pass voltage Vpass2 greater than the fifth threshold voltage Vt5 to the third bottom select transistors BSG3; and apply a third pass voltage Vpass3 greater than the sixth threshold voltage Vt6 to the fourth bottom select transistors BSG4.

Figure 12:
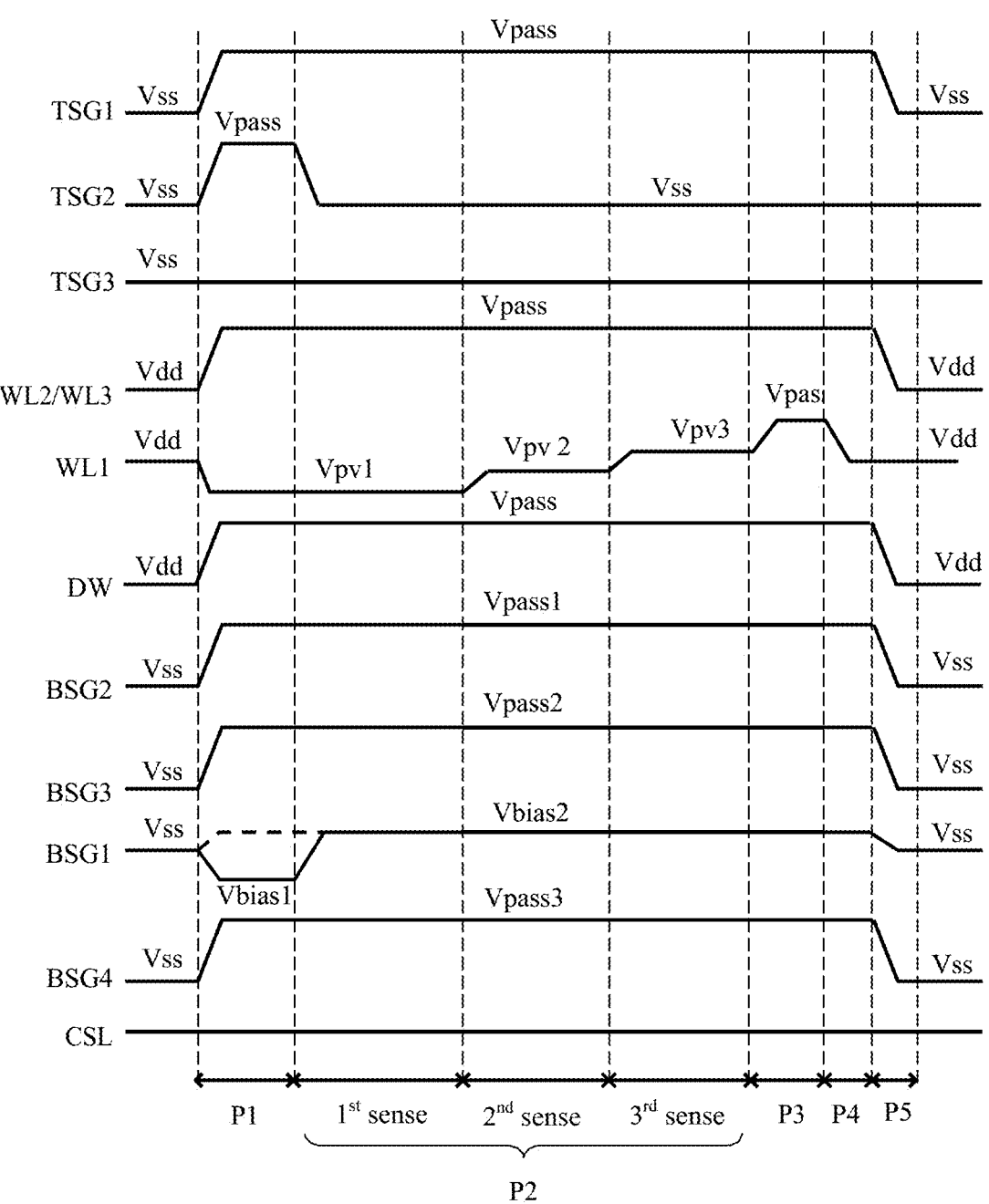
FIG. 12 is a voltage graph II of performing a programming verification operation on memory cells in a first finger memory region as provided in an implementation of the present disclosure.

It is to be noted that in the example shown in FIG. 12, starting voltages of the word lines WL1, WL2 and WL3 and the dummy word line DW are the power supply voltage Vdd, thereby reducing the establishment time of voltage on the word lines, but the present disclosure is not limited to this. In some other implementations, starting voltages of the word lines WL1, WL2 and WL3 and the dummy word line DW may be the ground voltage Vss, in which case the pass voltage also needs to be applied to the selected word line WL1 in the first pre-charge phase P1 so as to turn on the unselected memory cell strings in the first finger memory region 10.

In implementations of the present disclosure, except for the first pass voltage Vpass1, the second pass voltage Vpass2, the third pass voltage Vpass3 and a fourth pass voltage Vpass4 for which the relative magnitudes are limited specifically, other pass voltages Vpass refer to voltages that can turn on corresponding memory cells or transistors and the specific magnitudes are not limited in the present disclosure.

In some implementations, in the first pre-charge phase P1, the peripheral circuit is configured to apply a higher voltage to bottom select transistors other than the first bottom select transistors BSG1 to put the other bottom select transistors in the on-state. At this time, the voltage needed to be applied to the first bottom select transistors BSG1 can turn on the first bottom select transistors BSG1 in the first finger memory region 10 and turn off the first bottom select transistors BSG1 in the second finger memory region 20. Thus, the memory cell strings in the first finger memory region 10 are in on-state with channels coupled with the common source line CSL and the common source line CSL coupled with the ground voltage Vss. Therefore, it is possible to set the channel voltages in the first finger memory region 10 to the ground voltage Vss and set the channels of memory cell strings in the second finger memory region 20 into the floating state, and the channel voltages would be coupled to the higher voltage by gate voltages.

In implementations of the present disclosure, the peripheral circuit is configured to perform a pre-charge operation only on memory cell strings in the first finger memory region 10 in the first pre-charge phase P1. On one hand, performing the pre-charge operation on all memory cell strings in the first finger memory region 10 can set channel voltages of the unselected memory cell strings in the first finger memory region 10 to the ground voltage Vss. Therefore, in the subsequent first sensing phase P2, considering the unselected memory cell string 111 as an example, when the memory cells in the memory cell string 111 that are connected with the selected word line WL1 are in off-state, both the voltage of the channel between the top select transistor TSG2 and the memory cell and the voltage of the channel between the memory cell and the first bottom select transistor BSG1 are kept at the ground voltage Vss without any large voltage difference generated nearby the channel of the memory cell. Therefore, it is possible to effectively mitigate the hot carrier injection (HCI) effect caused by large voltage difference and reduce the threshold voltage shift generated by unselected memory cells during the programming operation of the selected memory cells. On the other hand, in the first pre-charge phase P1, the memory cell strings in the finger memory region 20 are in floating state, which can mitigate the coupling effect between memory cell strings in the finger memory region 20 and the selected word line WL1, thereby reducing the establishment time of voltage on the word line WL1 and improving the efficiency of the programming verification operation.

In some implementations, as shown in FIG. 10, in the first pre-charge phase P1, in order to turn on the first bottom select transistors BSG1 in the first finger memory region 10 and turn off the first bottom select transistors BSG1 in the second finger memory region 20, the peripheral circuit may be configured to apply a second bias voltage Vbias2 smaller than the second threshold voltage Vt2 and greater than the first threshold voltage Vt1 to the first bottom select transistors BSG1. However, in this case, as illustrated by dotted line part of the voltage graph corresponding to the first bottom select transistors BSG1 in FIG. 10, in the first pre-charge phase P1, when the peripheral circuit apply a higher voltage to the bottom select transistors other than the first bottom select transistors BSG1, in a voltage rising period, the voltage on the first bottom select transistors BSG1 may be coupled to the higher voltage that may be higher than the second threshold voltage Vt2 due to the coupling effect between the bottom select lines, such that the first bottom select transistors BSG1 in the second finger memory region 20 cannot be turned off completely.

Figure 11:
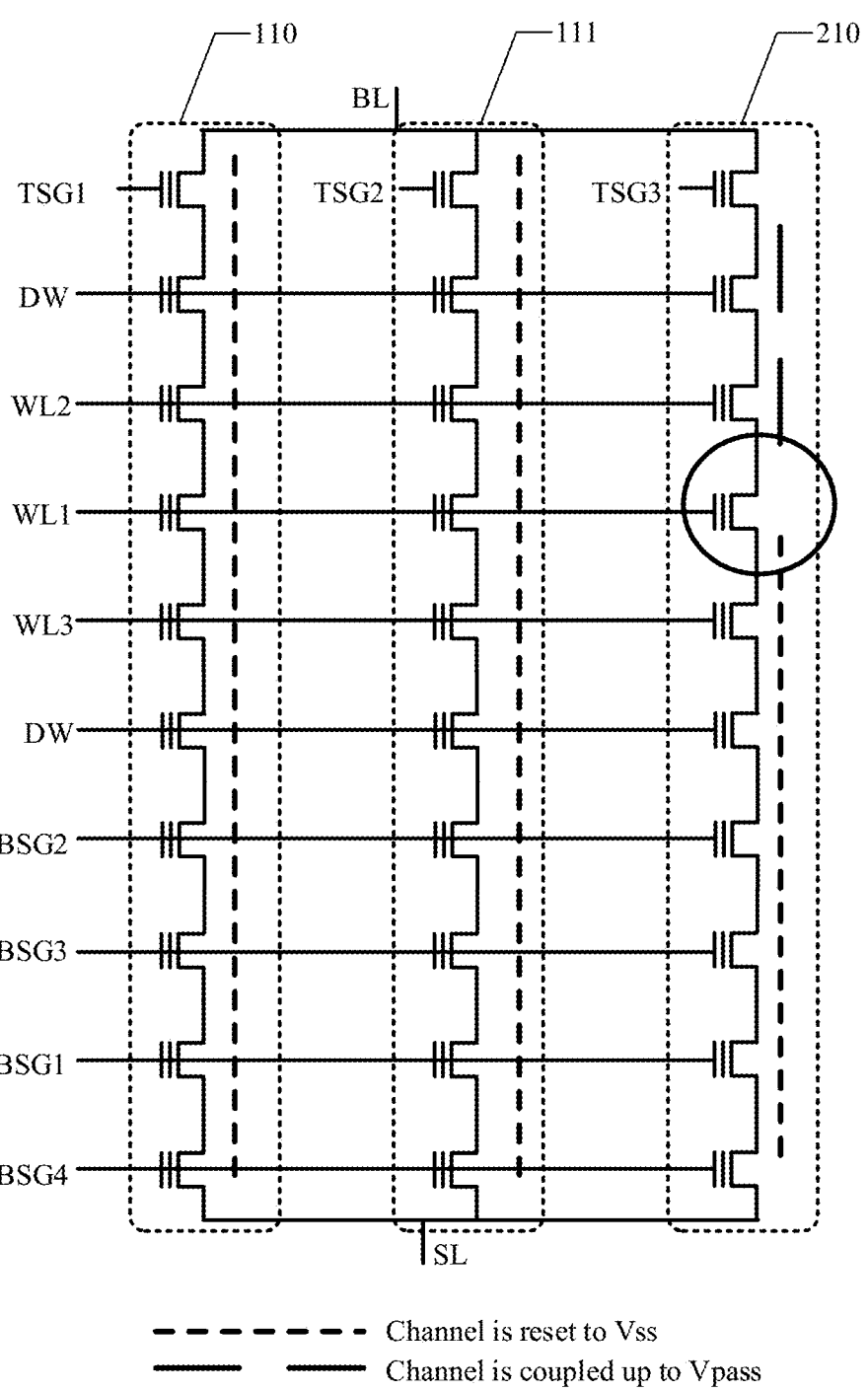
FIG. 11 is a circuit diagram II of a memory array provided in an implementation of the present disclosure.

As shown in FIG. 11, in the above-described implementation, considering the memory cell string 210 in the second finger memory region 20 as an example, since the voltage on the first bottom select transistors BSG1 are coupled to the higher voltage such that the first bottom select transistor BSG1 in the memory cell string 210 cannot be turned off completely, while the memory cells in the memory cell string 210 that is connected with the selected word line WL1 are still in off-state, such that the channels between the memory cells and the first bottom select transistors BSG1 are coupled with the common source line CSL and the channel voltage is set to the ground voltage Vss. Whereas the channels between the memory cells and the top select transistors TSG3 is still in floating state and the channel voltage is still coupled to the higher voltage by gate voltages. In this case, a large voltage difference will arise in the channel nearby the memory cell such that the threshold voltage of the memory cell may shift due to the hot carrier injection effect.

In some implementations, the peripheral circuit is configured to: in the first pre-charge phase P1 for performing a programming verification operation on the memory cells in the first finger memory region 10, apply a first bias voltage Vbias1 to the first bottom select transistors BSG1; and in the first sensing phase P2 after the first pre-charge phase P1, apply a second bias voltage Vbias2 to the first bottom select transistors BSG2 with the first bias voltage Vbias1 being smaller than the second bias voltage Vbias2.

In some examples, the first bias voltage Vbias1 is greater than or equal to the negative second pass voltage Vpass2, and the second bias voltage Vbias2 is smaller than the second pass voltage Vpass2.

In some examples, the first bias voltage Vbias1 is greater than or equal to the negative third pass voltage Vpass3, and the second bias voltage Vbias2 is smaller than the third pass voltage Vpass3.

In an example, as shown in FIG. 12, in the voltage graph corresponding to the first bottom select transistors BSG1, the solid line represents the voltage applied on the first bottom select transistors BSG1 by the peripheral circuit and the dotted line represents the actual voltage on the first bottom select transistors BSG1. Applying a lower first bias voltage Vbias1 to the first bottom select transistors BSG1 in the first pre-charge phase P1 can migrate the trend of upward shifting of the voltage on the first bottom select transistors BSG1 due to the coupling effect between bottom select lines, which in turn allows the actual voltage on the first bottom select transistors BSG1 to be stabilized near the second bias voltage Vbias2 such that the first bottom select transistors BSG1 in the second finger memory region 20 remains in off-state, thereby reducing shifting of threshold voltage of the memory cell in the second finger memory region 20 due to the hot carrier injection effect. Therefore, it is possible to improve the efficiency of the programming verification operation while further improving the reliability of programming operation of the memory device.

In the above-described example, the peripheral circuit applies the first bias voltage Vbias1 of a fixed voltage value on the first bottom select transistors BSG1 until the end of the first pre-charge phase P1. However, the present disclosure is not limited to this.

In some implementations, the peripheral circuit may stop applying the first bias voltage Vbias1 on the first bottom select transistors BSG1 before the end of the first pre-charge phase P1, and the voltage applied on the first bottom select transistors BSG1 by the peripheral circuit begins to gradually increase from the first bias voltage Vbias1 to the second bias voltage Vbias2.

In some implementations, the voltage value of the first bias voltage Vbias1 may also be variable. It may decrease gradually from the ground voltage Vss to the minimum in an initial stage of the first pre-charge phase P1 and then gradually increase from the minimum to the maximum. Or it may vary in other suitable manner to dynamically adjust the actual voltage on the first bottom select transistors BSG1.

It is appreciated that the influence on the voltage on the first bottom select transistors BSG1 by the coupling effect is mainly concentrated in the initial stage of the first pre-charge phase P1, namely the stage in which voltages are established on the bottom select lines and word lines connected with other bottom select transistors. In this stage, voltages on the bottom select lines and the word lines increase gradually from the starting voltage to a higher pass voltage with a large variation rate, which would strengthen the coupling effect and cause an upward shifting trend on the voltage on the first bottom select transistors BSG1. Therefore, it is possible to apply the first bias voltage Vbias1 to the first bottom select transistors BSG1 only in the first pre-charge phase P1 or the initial stage of the first pre-charge phase PL.

In some implementations, referring back to FIG. 12, in the first sensing phase P2 after the first pre-charge phase P1, the peripheral circuit is configured to: apply the second bias voltage Vbias2 to the first bottom select transistors BSG1; continue applying the first pass voltage Vpass1 to the second bottom select transistors BSG2, applying the second pass voltage Vpass2 to the third bottom select transistors BSG3 and applying the third pass voltage Vpass3 to the fourth bottom select transistors BSG4; turn off the unselected top select transistors TSG2 in the first finger memory region 10; turn off the top select transistors TSG3 in the second finger memory region 20; keep the selected top select transistors TSG1 in the first finger memory region 10 to be turned on; continue applying the pass voltage Vpass to the unselected word lines WL2/WL3 and the dummy word line; apply a first verification voltage Vpv1, a second verification voltage Vpv2 and a third verification voltage Vpv3 successively to the selected word line WL1 to perform a sensing operation on the selected memory cells.

Here, an example in which the first sensing phase P2 includes three sensing operations is described. However, the present disclosure is not limited thereto. In some other implementations, the sensing phase may include only two sensing operations, and may also include more than three sensing operations.

In some implementations, as shown in FIG. 12, the periphery circuits are further configured to: in a first preparation phase P3 after the first sensing phase P2, apply the pass voltage Vpass to the selected word line WL1 to turn on the selected memory cells such that electrons accumulated in the channel of the selected memory cell string may be released; in a second preparation phase P4 after the first preparation stage P3, apply the power supply voltage Vdd to the word line WL1 to allow the voltage on the word line WL1 to gradually decrease from the pass voltage Vpass to the power supply voltage Vdd such that electrons remained in the channel are released along the bit line direction; and in a third preparation phase P5 after the second preparation phase P4, apply the power supply voltage Vdd to the word lines WL2, the word line WL3 and the dummy word line DW and apply the ground voltage Vss to other select lines such that voltages on the word lines and the select lines are all restored to the voltage before the programming verification operation is performed.

Figure 13:
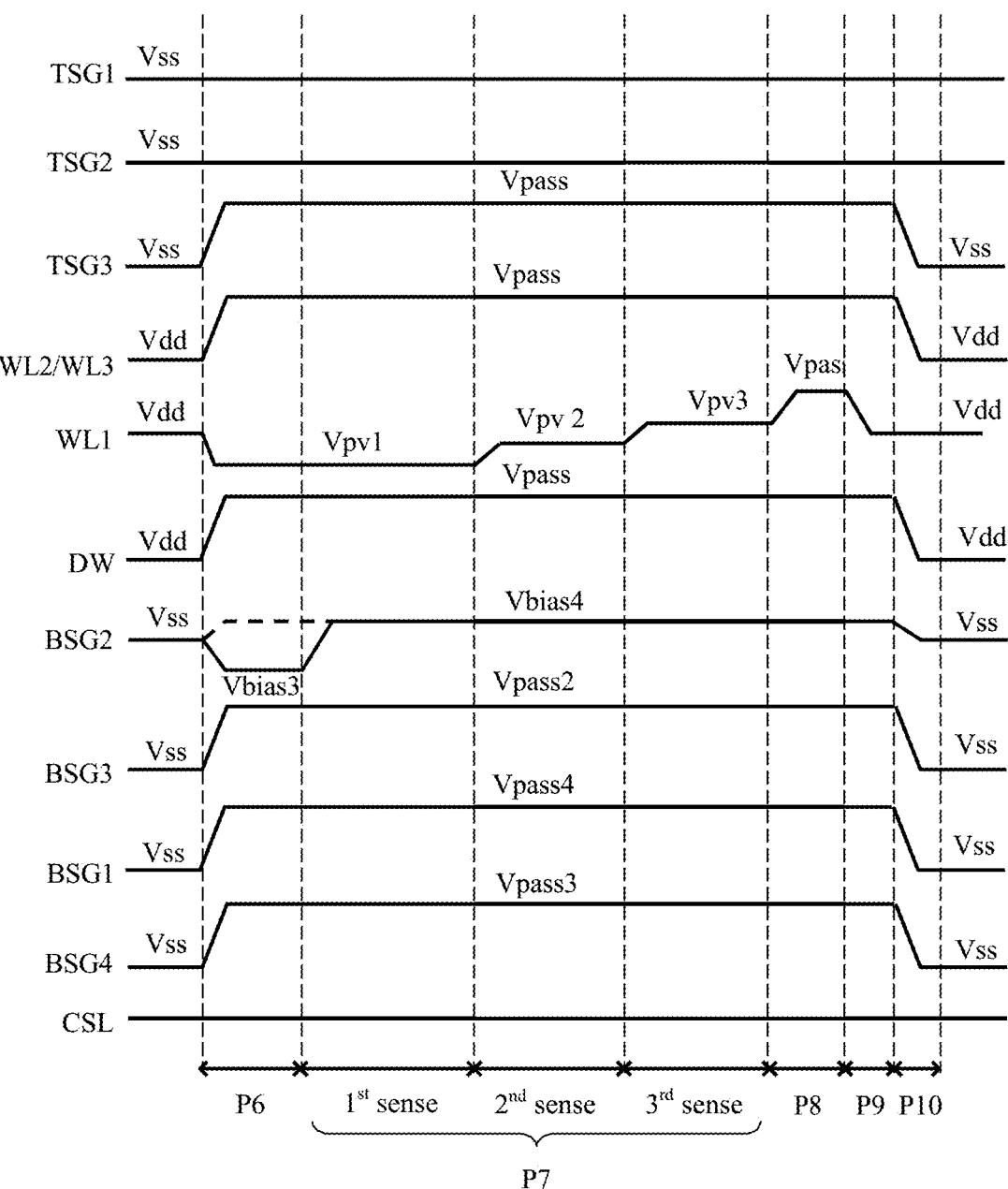
FIG. 13 is a voltage graph of performing a programming verification operation on memory cells in a second finger memory region as provided in an implementation of the present disclosure.

In another example, FIG. 13 is a voltage graph at the time of performing a programming verification operation on memory cells in the second finger memory region 20. As shown in FIG. 13, the peripheral circuit is further configured to: in a second pre-charge phase P6 of the programming verification operation on the memory cells in the second finger memory region 20, apply the fourth pass voltage Vpass4 greater than the second threshold voltage Vt2 to the first bottom select transistors BSG1 and apply a third bias voltage Vbias3 to the second bottom select transistors BSG2; and in a second sensing phase P7 after the second pre-charge phase P6, apply the fourth pass voltage Vpass4 to the first bottom select transistors BSG1 and apply a fourth bias voltage Vbias4 to the second bottom select transistors BSG2, wherein the third bias voltage Vbias3 is smaller than the fourth bias voltage Vbias4 and the fourth bias voltage Vbias4 is smaller than the third threshold voltage Vt3 and greater than the fourth threshold voltage Vt4.

In implementations of the present disclosure, similar to performing a programming verification operation on the memory cells in the first finger memory region 10, when a programming verification operation is performed on the memory cells in the second finger memory region 20, a lower third bias voltage Vbias3 is applied by the periphery circuits to the second bottom select transistors BSG2 firstly, which can migrate the trend of upward shifting of the voltage on the second bottom select transistors BSG2 due to the coupling effect between bottom select lines or the coupling effect between the dummy word line and the bottom select lines, such that the actual voltage on the second bottom select transistors BSG2 can be stabilized near the fourth bias voltage Vbias4 and the second bottom select transistors BSG2 in the first finger memory region 10 remains in off-state, thereby reducing shifting of threshold voltage of the memory cells in the first finger memory region 10 due to the hot carrier injection effect. Therefore, it is possible to improve the efficiency of the programming verification operation while further improving the reliability of programming operation of the memory device.

It is to be noted that in implementations of the present disclosure, the peripheral circuit is configured to perform programming operations including a plurality of programming loops on the memory cells in the first finger memory region 10 or the second finger memory region 20. Each programming loop may include a programming pulse application operation and a programming verification operation. For the plurality of programming loops, the programming pulses applied on the selected word line may be incremental, and the verification voltages applied on the selected word line may also be different. FIGS. 12 and 13 are voltage graphs when programming verification operations are performed on the memory cells. That is, the above-described example only illustrates a programming verification operation in one programming loop as an example. Before the programming verification operation, the periphery circuits are further configured to perform the programming pulse application operation.

In implementations of the present disclosure, the above description of FIG. 6 may be referred to for the specific constitution and function implementation of peripheral circuit. In the peripheral circuit, the control logic may control the row decoder/word line driver to apply voltages generated by the voltage generator to the top select transistors, bottom select transistors, word lines and dummy word lines in the above-described implementations via the row decoder/word line driver.

Based on the similar concept to the above-described memory device, the present disclosure further provides a memory system including at least one memory device according to any of the above-described implementations; a controller coupled with the at least one memory device and configured to control the memory device. The specific constitution and function implementation of the memory system may refer to the above description of FIGS. 1-7 and will not be repeated here for brevity.

Based on the same concept as the above-described memory device, the present disclosure further provides an operation method of a memory device. FIG. 14 is the flow chart of the operation method of the memory device. The method includes the following operations:

Operation S1000: applying a first bias voltage to the first bottom select transistor in each memory cell string in the first pre-charge phase of the programming verification operation on the memory cells in the first finger memory region;

Operation S2000: applying a second bias voltage to the first bottom select transistors in the first sensing phase after the first pre-charge phase; wherein the first bias voltage is smaller than the second bias voltage; and the second bias voltage is smaller than the second threshold voltage of the first bottom select transistors in the second finger memory region and greater than the first threshold voltage of the first bottom select transistors in the first finger memory region.

Referring to FIGS. 7, 12 and 14 in combination, performing operation S1000 includes: applying a first bias voltage Vbias1 to the first bottom select transistors BSG1 in the first pre-charge phase P1 of the programming verification operation on the memory cells in the first finger memory region 10. Performing operation S2000 includes: applying a second bias voltage Vbias2 to the first bottom select transistors BSG1 in the first sensing phase P2 after the first pre-charge phase P1; wherein the first bias voltage Vbias1 is smaller than the second bias voltage Vbias2; and the second bias voltage Vbias2 is smaller than the second threshold voltage Vt2 of the first bottom select transistors BSG1 in the second finger memory region 20 and greater than the first threshold voltage Vt1 of the first bottom select transistors in the first finger memory region 10.

In some implementations, the operating method of the memory device further includes: applying a first pass voltage Vpass1 to the second bottom select transistor BSG2 in each memory cell string in the first pre-charge phase P1 and the first sensing phase P2, wherein the second bottom select transistors BSG2 in the first finger memory region 10 have a third threshold voltage Vt3 greater than a fourth threshold voltage Vt4 of the second bottom select transistors BSG2 in the second finger memory region 20, and the first pass voltage Vpass1 is greater than the third threshold voltage Vt3.

In some implementations, the operating method of the memory device further includes: applying a second pass voltage Vpass2 to the third bottom select transistors BSG3 between the first bottom select transistors BSG1 and the second bottom select transistors BSG2 in the first pre-charge phase P1 and the first sensing phase P2, wherein the second pass voltage Vpass2 is greater than the fifth threshold voltage of the third bottom select transistors BSG3.

In some examples, the first bias voltage Vbias1 is greater than or equal to the negative second pass voltage Vpass2, and the second bias voltage Vbias2 is smaller than the second pass voltage Vpass2.

In some implementations, the operating method of the memory device further includes: applying a third pass voltage Vpass3 to the fourth bottom select transistors BSG4 closer to the common source line CSL than the first bottom select transistors BSG1 and the second bottom select transistors BSG2 in the first pre-charge phase P1 and the first sensing phase P2, wherein the third pass voltage Vpass3 is greater than the sixth threshold voltage Vt6 of the fourth bottom select transistors BSG4.

In some examples, the first bias voltage Vbias1 is greater than or equal to the negative third pass voltage Vpass3, and the second bias voltage Vbias2 is smaller than the third pass voltage Vpass3.

In some implementations, the operating method of the memory device further includes: turning on the top select transistors TSG1 and TSG2 in the first finger memory region 10 in the first pre-charge phase P1; turning off the unselected top select transistors TSG2 in the first finger memory region 10 and turning on the selected top select transistors TSG1 in the first finger memory region 10 in the first sensing phase P2; and turning off the top select transistors TSG3 in the second finger memory region 20 in the first pre-charge phase P1 and the first sensing phase P2.

In some implementations, referring to FIGS. 7 and 13 in combination, the operating method of the memory device further includes: in the second pre-charge phase P6 of the programming verification operation on the memory cells in the second finger memory region 20, applying the fourth pass voltage Vpass4 greater than the second threshold voltage Vt2 to the first bottom select transistors BSG1 and applying the third bias voltage Vbias3 to the second bottom select transistors BSG2; and in the second sensing phase P7 after the second pre-charge phase P6, applying the fourth pass voltage Vpass4 to the first bottom select transistors BSG1 and applying the fourth bias voltage Vbias4 to the second bottom select transistors BSG2, wherein the third bias voltage Vbias3 is smaller than the fourth bias voltage Vbias4 and the fourth bias voltage Vbias4 is smaller than the third threshold voltage Vt3 and greater than the fourth threshold voltage Vt4.

In implementations of the present disclosure, it is possible to select only one finger memory region for programming operations including the programming verification operation so as to improve the programming efficiency. Considering an example in which the programming verification operation is performed on the memory cells in the first finger memory region 10, it is possible to apply a lower first bias voltage Vbias1 to the first bottom select transistors BSG1 in the first pre-charge phase P1 of the programming verification operation to migrate the trend of upward shifting of the voltage on the first bottom select transistors BSG1 due to the coupling effect between bottom select lines, such that the actual voltage on the first bottom select transistors BSG1 can be stabilized near the second bias voltage Vbias2, and the first bottom select transistors BSG1 in the second finger memory region 20 remains in off-state, which reduces the shifting of the threshold voltage of the memory cells in the second finger memory region 20 due to the hot carrier injection effect. Therefore, it is possible to improve the efficiency of the programming verification operation while further improving the reliability of programming operation of the memory device.

The features disclosed in the device implementations provided in the present disclosure may be combined in any manner without conflicts to obtain new device implementations.

The methods disclosed in the method implementations provided in the present disclosure may be combined in any manner without conflicts to obtain new method implementations.

What have been described above are only implementations of the present disclosure. However, the scope of the present disclosure is not limited thereto, and variations or substitutions that easily occur to technicians familiar with the art in the scope disclosed in the present disclosure should be encompassed in the scope of the present disclosure. Therefore, the scope of the present disclosure should be determined by the scope of the claims.

What is claimed is:

1. A memory device, comprising a memory array and a peripheral circuit coupled with the memory array, wherein:
   the memory array comprises a first finger memory region and a second finger memory region each comprising a plurality of memory cell strings; each of the memory cell strings comprises a first bottom select transistor and a second bottom select transistor; first bottom select transistors in the first finger memory region have a first threshold voltage, first bottom select transistors in the second finger memory region have a second threshold voltage, and the first threshold voltage is smaller than the second threshold voltage; second bottom select transistors in the first finger memory region have a third threshold voltage; and
   the peripheral circuit is configured to:
      apply a first bias voltage to first bottom select transistors in the first finger memory region in a first pre-charge phase of a programming verification operation on memory cells in the first finger memory region;
      apply a second bias voltage to the first bottom select transistors in the first finger memory region in a first sensing phase after the first pre-charge phase, wherein the first bias voltage is smaller than the second bias voltage; and the second bias voltage is smaller than the second threshold voltage and greater than the first threshold voltage; and
      apply a first pass voltage greater than the third threshold voltage to the second bottom select transistors in the first finger memory region in the first pre-charge phase and the first sensing phase.

2. The memory device of claim 1, wherein second bottom select transistors in the second finger memory region have a fourth threshold voltage, and the third threshold voltage is greater than the fourth threshold voltage; and
   wherein apply the first pass voltage greater than the third threshold voltage to the second bottom select transistors comprises:
   apply the first pass voltage greater than the third threshold voltage to the second bottom select transistors in the first finger memory region in the first pre-charge phase and the first sensing phase.

3. The memory device of claim 2, wherein each of the memory cell strings further comprises a third bottom select transistor, the third bottom select transistor is between the first bottom select transistor and the second bottom select transistor and has a fifth threshold voltage; and
   the peripheral circuit is further configured to apply a second pass voltage greater than the fifth threshold voltage to the third bottom select transistor in the first pre-charge phase and the first sensing phase.

4. The memory device of claim 3, wherein the first bias voltage is greater than or equal to a negative second pass voltage and the second bias voltage is smaller than the second pass voltage.

5. The memory device of claim 2, wherein the memory array further comprises a common source line connected with each of the memory cell strings, each of the memory cell strings further comprises a fourth bottom select transistor, the fourth bottom select transistor is closer to the common source line than the first bottom select transistor and the second bottom select transistor and has a sixth threshold voltage; and
   the peripheral circuit is further configured to apply a third pass voltage greater than the sixth threshold voltage to the fourth bottom select transistor in the first pre-charge phase and the first sensing phase.

6. The memory device of claim 5, wherein the first bias voltage is greater than or equal to a negative third pass voltage and the second bias voltage is smaller than the third pass voltage.

7. The memory device of claim 2, wherein the peripheral circuit is further configured to:
   apply a fourth pass voltage greater than the second threshold voltage to the first bottom select transistors in the second finger memory region and apply a third bias voltage to the second bottom select transistors in the second finger memory region in a second pre-charge phase of a programming verification operation on memory cells in the second finger memory region; and apply the fourth pass voltage to the first bottom select transistors in the second finger memory region and apply a fourth bias voltage to the second bottom select transistors in the second finger memory region in a second sensing phase after the second pre-charge phase, wherein the third bias voltage is smaller than the fourth bias voltage; and the fourth bias voltage is smaller than the third threshold voltage and greater than the fourth threshold voltage.

8. The memory device of claim 1, wherein each of the memory cell strings further comprises a top select transistor; and the peripheral circuit is further configured to:

turn on top select transistors in the first finger memory region in the first pre-charge phase;

turn off unselected top select transistors in the first finger memory region and turn on selected top select transistors in the first finger memory region in the first sensing phase; and turn off top select transistors in the second finger memory region in the first pre-charge phase and the first sensing phase.

9. A memory system, comprising:

at least one memory device, each of the at least one memory device comprises a memory array and a peripheral circuit coupled with the memory array, wherein:

the memory array comprises a first finger memory region and a second finger memory region each comprising a plurality of memory cell strings, each of the memory cell strings comprises a first bottom select transistor and a second bottom select transistor, first bottom select transistors in the first finger memory region have a first threshold voltage, first bottom select transistors in the second finger memory region have a second threshold voltage, and the first threshold voltage is smaller than the second threshold voltage; second bottom select transistors in the first finger memory region have a third threshold voltage; and the peripheral circuit is configured to:

apply a first bias voltage to first bottom select transistors in the first finger memory region in a first pre-charge phase of a programming verification operation on memory cells in the first finger memory region;

apply a second bias voltage to the first bottom select transistors in the first finger memory region in a first sensing phase after the first pre-charge phase; wherein the first bias voltage is smaller than the second bias voltage; and the second bias voltage is smaller than the second threshold voltage and greater than the first threshold voltage; and apply a first pass voltage greater than the third threshold voltage to the second bottom select transistors in the first finger memory region in the first pre-charge phase and the first sensing phase; and a controller coupled with the at least one memory device and configured to control the at least one memory device.

10. The memory system of claim 9, wherein second bottom select transistors in the second finger memory region have a fourth threshold voltage, and the third threshold voltage is greater than the fourth threshold voltage; and wherein apply the first pass voltage greater than the third threshold voltage to the second bottom select transistors comprises:

apply the first pass voltage greater than the third threshold voltage to the second bottom select transistors in the first finger memory region in the first pre-charge phase and the first sensing phase.

11. The memory device of claim 10, wherein each of the memory cell strings further comprises a third bottom select transistor, the third bottom select transistor is between the first bottom select transistor and the second bottom select transistor and has a fifth threshold voltage; and the peripheral circuit is further configured to apply a second pass voltage greater than the fifth threshold voltage to the third bottom select transistor in the first pre-charge phase and the first sensing phase.

12. The memory device of claim 11, wherein the first bias voltage is greater than or equal to a negative second pass voltage and the second bias voltage is smaller than the second pass voltage.

13. A operating method of a memory device, comprising:

applying a first bias voltage to a first bottom select transistor in each of memory cell strings in a first pre-charge phase of a programming verification operation on memory cells in a first finger memory region of a memory device, wherein each of the memory cell strings comprises a first bottom select transistor and a second bottom select transistor, and wherein second bottom select transistors in the first finger memory region have a third threshold voltage;

applying a second bias voltage to the first bottom select transistor in a first sensing phase after the first pre-charge phase, wherein the first bias voltage is smaller than the second bias voltage; and the second bias voltage is smaller than a second threshold voltage of first bottom select transistors in a second finger memory region of the memory device and greater than a first threshold voltage of first bottom select transistors in the first finger memory region of the memory device; and applying a first pass voltage greater than a third threshold voltage to second bottom select transistors in the first finger memory region in the first pre-charge phase and the first sensing phase.

14. The operating method of the memory device of claim 13, wherein apply the first pass voltage greater than the third threshold voltage to the second bottom select transistors comprises:

applying the first pass voltage to a second bottom select transistor in each of the memory cell strings in the first pre-charge phase and the first sensing phase, wherein the third threshold voltage is greater than a fourth threshold voltage of second bottom select transistors in the second finger memory region.

15. The operating method of the memory device of claim 14, further comprising:

applying a second pass voltage to a third bottom select transistor between the first bottom select transistor and the second bottom select transistor in the first pre-charge phase and the first sensing phase, wherein the second pass voltage is greater than a fifth threshold voltage of the third bottom select transistor.

16. The operating method of the memory device of claim 15, wherein the first bias voltage is greater than or equal to a negative second pass voltage and the second bias voltage is smaller than the second pass voltage.

17. The operating method of the memory device of claim 14, further comprising:

applying a third pass voltage to a fourth bottom select transistor closer to a common source line than the first bottom select transistor and the second bottom select transistor in the first pre-charge phase and the first sensing phase, wherein the third pass voltage is greater than a sixth threshold voltage of the fourth bottom select transistor.

18. The operating method of the memory device of claim 17, wherein the first bias voltage is greater than or equal to a negative third pass voltage and the second bias voltage is smaller than the third pass voltage.

19. The operating method of the memory device of claim 14, further comprising:

applying a fourth pass voltage greater than the second threshold voltage to the first bottom select transistor; and applying a third bias voltage to the second bottom select transistor in a second pre-charge phase of a programming verification on the memory cells in the second finger memory region; and applying the fourth pass voltage to the first bottom select transistor and applying a fourth bias voltage to the second bottom select transistor in a second sensing phase after the second pre-charge phase, wherein the third bias voltage is smaller than the fourth bias voltage; and the fourth bias voltage is smaller than the third threshold voltage and greater than the fourth threshold voltage.

20. The operating method of the memory device of claim 13, further comprising:

turning on top select transistors in the first finger memory region in the first pre-charge phase;

turning off unselected top select transistors in the first finger memory region and turning on selected top select transistors in the first finger memory region in the first sensing phase; and turning off top select transistors in the second finger memory region in the first pre-charge phase and the first sensing phase.

* * * * *